United States Patent
Hashimoto

(10) Patent No.: US 6,483,718 B2
(45) Date of Patent: Nov. 19, 2002

(54) SEMICONDUCTOR DEVICE AND METHOD OF MANUFACTURE THEREOF, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/934,587

(22) Filed: Aug. 23, 2001

(65) Prior Publication Data

US 2002/0048158 A1 Apr. 25, 2002

(30) Foreign Application Priority Data

Sep. 5, 2000 (JP) ........................................ 2000-269101

(51) Int. Cl.⁷ ................................................ H05K 1/11
(52) U.S. Cl. ........................ 361/803; 361/790; 361/783; 361/784; 257/686
(58) Field of Search ................................. 361/743, 744, 361/760, 761, 783, 784, 790, 803; 257/685, 686, 723; 174/260–263, 267

(56) References Cited

U.S. PATENT DOCUMENTS

| 5,241,454 A | * | 8/1993 | Ameen et al. ............... 174/255 |
| 5,491,304 A | * | 2/1996 | Lau et al. ................... 174/260 |
| 5,613,033 A | * | 3/1997 | Swamy et al. ............... 361/735 |
| 5,637,920 A | * | 6/1997 | Loo ........................... 257/700 |
| 5,796,590 A | * | 8/1998 | Klein ......................... 174/260 |
| 5,857,858 A | * | 1/1999 | Gorowitz et al. ............ 257/686 |
| 6,137,163 A | * | 10/2000 | Kim et al. ................... 257/686 |
| 6,188,127 B1 | * | 2/2001 | Senba et al. ................ 257/685 |
| 6,297,960 B1 | * | 10/2001 | Moden et al. ............... 257/724 |

FOREIGN PATENT DOCUMENTS

JP    A 8-236694    9/1996

* cited by examiner

Primary Examiner—Kamand Cuneo
Assistant Examiner—Tuan Dinh
(74) Attorney, Agent, or Firm—Oliff & Berridge, PLC

(57) ABSTRACT

A semiconductor device includes a plurality of semiconductor chips; and a plurality of substrates, each of the substrates having one of the semiconductor chips mounted thereon. The substrates are stacked each other. The upper and lower ones of the semiconductor chips mounted on a pair of the stacked substrates are electrically connected through first terminals provided in a region outside the region in which one of the semiconductor chips is mounted in each of the substrates. The lowest one of the substrates has second terminals provided in its region closer to its center than its region in which the first terminals are provided, the second terminals electrically connected to one of the semiconductor chips. A pitch of adjacent two of the second terminals is wider than a pitch of adjacent two of the first terminals.

20 Claims, 6 Drawing Sheets

SEMICONDUCTOR DEVICE AND METHOD OF MANUFACTURE THEREOF, CIRCUIT BOARD, AND ELECTRONIC INSTRUMENT

Japanese Patent Application No. 2000-269101, filed Sep. 5, 2000, is hereby incorporated by reference in its entirety.

BACKGROUND OF THE INVENTION

1. Field of the Invention

The present invention relates to a semiconductor device and method of manufacture thereof, circuit board, and electronic instrument.

2. Description of Related Art

With the increasingly compact nature of electronic instruments, semiconductor devices are know with stacked construction incorporating a plurality of substrates (interposers) on which semiconductor chips are mounted laminated at high density. By means of this, the area of the circuit board (motherboard) on which the semiconductor devices are mounted is utilized efficiently, and an electronic instrument which is more compact and of high density can be manufactured.

For example, in Japanese Patent Application Laid-Open No. 8-236694, a semiconductor device of stacked construction, connector terminals connecting upper and lower semiconductor chips are disposed on the extremity of a substrate to avoid a semiconductor chip disposes in a central portion. Then the circuit board and semiconductor device of stacked construction are electrically connected by connector terminals provided at the extremity of the substrate, in the same way that upper and lower semiconductor chips are connected.

However, according to this form of connection of the semiconductor device to the circuit board, since the pitch of the terminals for connection of the semiconductor device to the circuit board is fine, an expensive circuit board fine interconnecting lines must be used. By means of this, it is difficult to position the semiconductor device on the circuit board, and because of this the yield when the semiconductor device is mounted may be reduced.

Furthermore, since the connector terminals disposed at the extremity of the substrate are formed outside the semiconductor chip, if the pitch of the connector terminals is increased, there is a problem in that the area of the circuit board occupied by the semiconductor device also increases.

SUMMARY

A semiconductor device according to the first aspect of the present invention comprises:

a plurality of semiconductor chips; and
a plurality of substrates, each of the substrates having one of the semiconductor chips mounted thereon,
wherein:
  the substrates are stacked each other;
  upper and lower ones of the semiconductor chips mounted on a pair of the stacked substrates are electrically connected through first terminals provided in a region outside the region in which one of the semiconductor chips is mounted in each of the substrates;
  the lowest one of the substrates has second terminals provided in its region closer to its center than its region in which the first terminals are provided, the second terminals electrically connected to one of the semiconductor chips; and
  a pitch of adjacent two of the second terminals is wider than a pitch of adjacent two of the first terminals.

A circuit board according to the second aspect of the present invention has the above-mentioned semiconductor device mounted thereon, and the semiconductor device is electrically connected to the circuit board through the second terminals.

An electronic instrument according to the third aspect of the present invention has the above-mentioned semiconductor device.

A method of manufacture of a semiconductor device according to the fourth aspect of the present invention comprises the steps of:

stacking a plurality of substrates, each of the substrates having one semiconductor chips mounted thereon, each of the substrates having an outline larger than each of the semiconductor chips; and electrically connecting upper and lower ones of the semiconductor chips through first terminals provided in a region outside the region in which one of the semiconductor chips is mounted in each of the substrates, wherein the lowest one of the substrates has second terminals provided in its region closer to its center than the first terminals, the second terminals are electrically connected to one of the semiconductor chips, and a pitch of adjacent two of the second terminals is wider than pitch of adjacent two of the first terminals.

According to the present invention, a semiconductor device of stacked construction which can easily be mounted on a circuit board can be manufactured.

DETAILED DESCRIPTION

Figure 1:
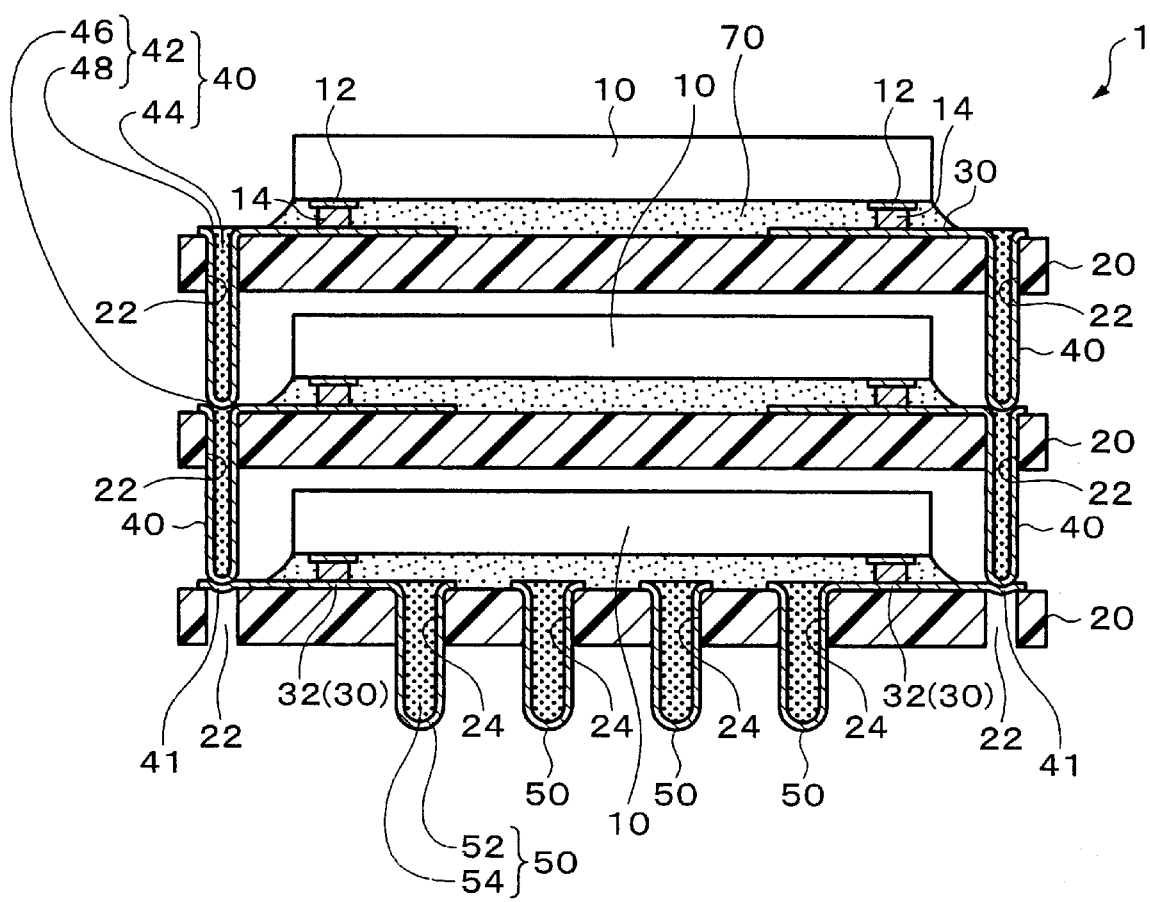
FIG. 1 shows a first embodiment of the semiconductor device to which the present invention is applied.

The embodiments of the present invention solve the above described problems in the prior art, and its object relates to the provision of a semiconductor device of stacked construction, in which the yield of mounting on a circuit board is increased, to a method of manufacture thereof, to a circuit board, and to an electronic instrument.

(1) A semiconductor device of one embodiment of the present invention comprises:

a plurality of semiconductor chips; and
a plurality of substrates, each of the substrates having one of the semiconductor chips mounted thereon,
wherein:
  the substrates are stacked with each other;
  upper and lower ones of the semiconductor chips mounted on a pair of the stacked substrates are electrically connected through first terminals provided in a region outside the region in which one of the semiconductor chips is mounted in each of the substrates;

the lowest one of the substrates has second terminals provided in its region closer to its center than its region in which the first terminals are provided, the second terminals electrically connected to one of the semiconductor chips; and a pitch of adjacent two of the second terminals is wider than a pitch of adjacent two of the first terminals.

According to this embodiment of the present invention, the pitch of the second terminals on the lowest substrate is wider than the pitch of the first terminals. By means of this, for example, the semiconductor device can easily be positioned on a circuit board. Therefore, the yield when the semiconductor device is mounted can be raised. Since it is not necessary to form fine interconnecting lines on the circuit board, a low cost circuit board can be used.

By the formation of the second terminals, the first terminals for connecting upper and lower semiconductor chips can be formed with a narrow pitch. Since the first terminals are formed in a region outside the semiconductor chips, this enables the plan area of the semiconductor device to be made small.

(2) In this semiconductor device, the first terminals may be arranged along an edge of one of the semiconductor chips; and the second terminals may be provided in a region in which one of the semiconductor chips is mounted.

By means of this, since the first terminals are formed arranged along the edge of the semiconductor chip, the size of the outline of the substrate can be made almost the same as the semiconductor chip. On the other hand, since the second terminals are formed in a region including the inside of the semiconductor chip on the substrate, they can be formed in the form of a region with a large two-dimension extent.

(3) In this semiconductor device, the first terminals may have projections formed to project from a surface of one of the substrates; and by means of the projections of the first terminals, the upper and lower ones of the semiconductor chips may be electrically connected.

By means of this, the upper and lower semiconductor chips can easily by electrically connected by the first terminals.

(4) In this semiconductor device, in each of the substrates, a plurality of first through holes may be formed; and the projections of the first terminals may project from the surface of one of the substrates through the first through holes.

By means of this, even when the interconnecting pattern is formed on one surface of the substrate, the projections of the first terminals can be made to project to oppose the other surface.

(5) In this semiconductor device, on each of the substrates, an interconnecting pattern may be formed;

the first terminals may be a part of the interconnecting pattern; and the projections of the first terminals may be formed by a part of the interconnecting pattern being bent in the direction away from the surface of one of the substrates.

By means of this, the first terminals are a part of the interconnecting pattern, and the projections of the first terminals are formed by bent portions of the interconnecting pattern. Therefore, the component count of the semiconductor device can be reduced and a low cost semiconductor device can be provided.

(6) In this semiconductor device, on each of the substrates, an interconnecting pattern may be formed; and the projections of the first terminals may be bumps provided so as to be electrically connected to the interconnecting pattern.

(7) In this semiconductor device, the second terminals may have external terminals on the lowest one of the substrates, the external terminals projecting from a surface of the lowest one of the substrates, the surface opposite to that opposing another of the substrates.

(8) In this semiconductor device, in the lowest one of the substrates, a plurality of second through holes may be formed; and the external terminals of the second terminals may project through the second through holes from the surface opposite to that opposing another of the substrates.

(9) In this semiconductor device, the external terminals of the second terminals may be bumps provided so as to be electrically connected to the interconnecting pattern.

(10) In this semiconductor device, the second terminals may be a part of the interconnecting pattern.

(11) In this semiconductor device, the external terminals of the second terminals may be formed by bending a part of the interconnecting pattern in the direction away from the surface opposite to that opposing another of the substrates.

By means of this, the component count of the semiconductor device can be reduced and a low cost semiconductor device can be provided.

(12) A circuit board of another embodiment of the present invention has the above-mentioned semiconductor device mounted thereon, and the semiconductor device is electrically connected to the circuit board through the second terminals.

(13) An electronic instrument according to further embodiment of the present invention has the above-mentioned semiconductor device.

(14) A method of manufacture of a semiconductor device of still another embodiment of the present invention comprising the steps of:

stacking a plurality of substrates, each of the substrates having one of semiconductor chips mounted thereon, each of the substrates having an outline larger than each of the semiconductor chips; and electrically connecting upper and lower ones of the semiconductor chips through first terminals provided in a region outside the region in which one of the semiconductor chips is mounted in each of the substrates, wherein the lowest one of the substrates has second terminals provided in its region closer to its center than the first terminals, the second terminals are electrically connected to one of the semiconductor chips, and a pitch of adjacent two of the second terminals is wider than a pitch of adjacent two of the first terminals.

According to the embodiments of the present invention, a semiconductor device of stacked construction which can easily be mounted on a circuit board can be manufactured.

The present invention is now described in terms of a number of preferred embodiments, with reference to the drawings. It should be noted, however, that the present invention is not limited to these embodiments.

First Embodiment

Figure 2:
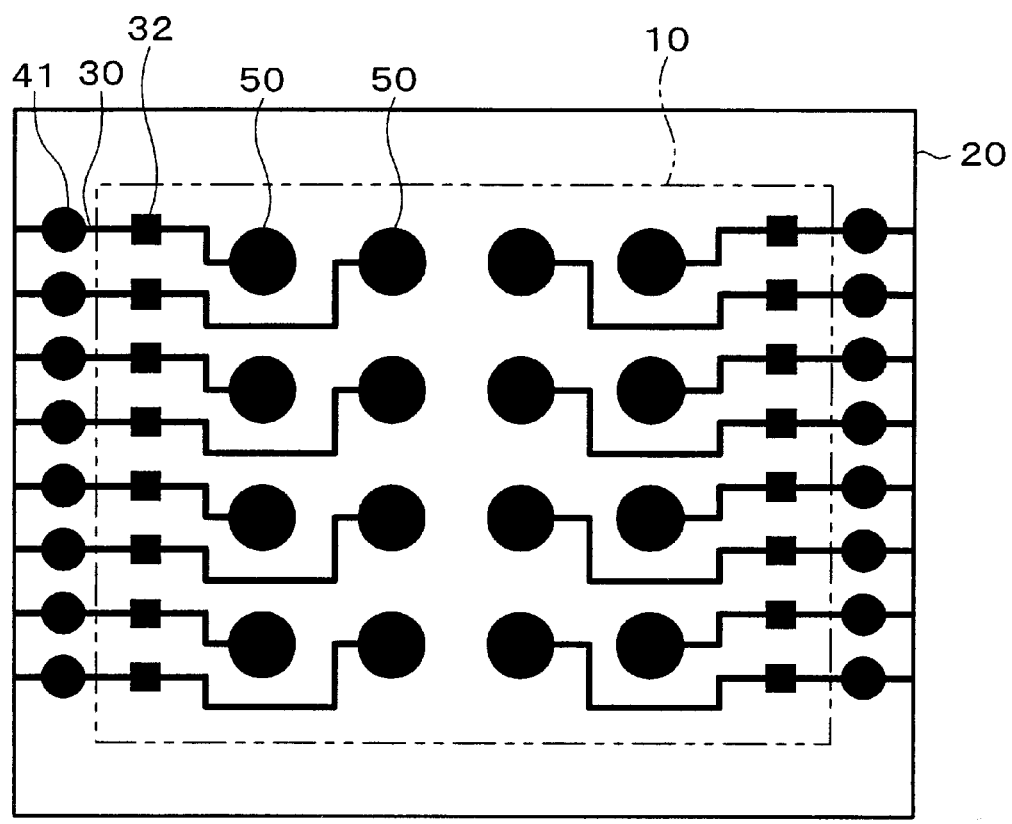
FIG. 2 shows a first embodiment of the semiconductor device to which the present invention is applied.
Figure 3:
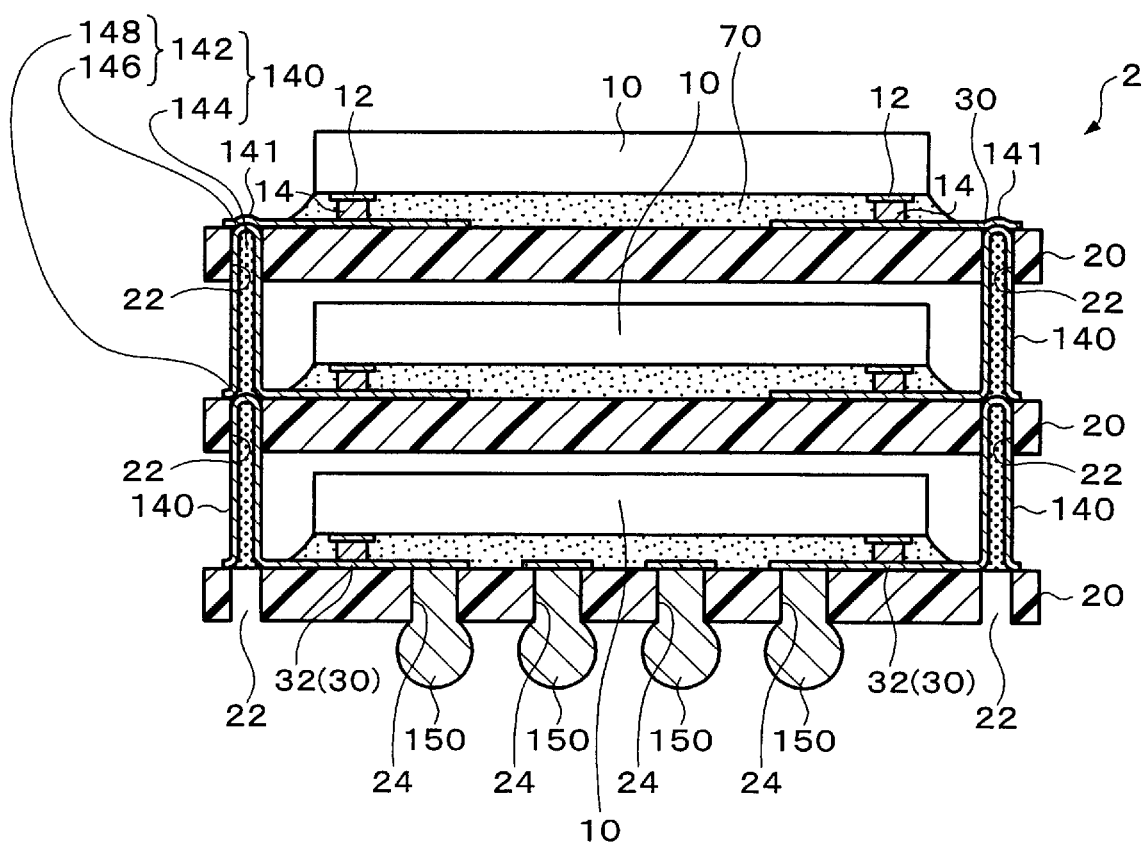
FIG. 3 shows a variant of the first embodiment of the semiconductor device to which the present invention is applied.

FIG. 1 to FIG. 3 show this embodiment of a semiconductor device. FIG. 1 is a cross-section of the semiconductor device, and FIG. 2 is a plan view of the lowest substrate 20. FIG. 3 is a sectional view of a variant of this embodiment of the semiconductor device.

A semiconductor device 1 shown in FIG. 1 comprises a plurality of semiconductor chips 10 and a plurality of substrates 20. Each semiconductor chip 10 is mounted on a substrate 20. The semiconductor device 1 is formed by respective substrates 20 being laminated, and upper and lower semiconductor chips 10 electrically connected. Such a semiconductor device 1 can be termed a semiconductor device of stacked construction.

The outline of the semiconductor chip 10 is commonly rectangular. The semiconductor chip 10 has a plurality of electrodes 12. The electrodes 12 are electrodes of the integrated circuit formed on the semiconductor chip 10. The electrodes 12 may be formed on the surface of the semiconductor chip 10 having the region in which the integrated circuit is formed. The electrodes 12 are commonly formed of the metal used for the interconnecting pattern of the integrated circuit, and may be formed of aluminum, aluminum alloy or copper or the like. The electrodes 12 may, as shown in FIG. 1, be formed at the extremity of the semiconductor chip 10, or may be formed in a central portion. When the electrodes 12 are arranged along the extremity of the semiconductor chip 10, they may be on a pair of opposing sides, or on all four sides. It should be noted that on the semiconductor chip 10, on the surface having the electrodes 12, an insulating film (passivation film) not shown in the drawings may be formed.

As shown in FIG. 1, on the electrodes 12 bumps 14 may be formed. When as shown in the drawing, the semiconductor chip 10 is subjected to face down bonding on the substrate 20, the bumps 14 are preferably formed. The bumps 14 may be formed of nickel or gold plated nickel, solder or gold or the like in ball form. Between the electrodes 12 and the bumps 14 a layer to prevent diffusion of the bump metal, of nickel, chromium, titanium or the like may be added.

The substrate 20 may be formed from either an organic or inorganic material, or from a composite structure thereof. As an example of an organic substrate may be cited a flexible substrate of a polyimide resin. As an inorganic substrate may be cited a ceramic substrate or a glass substrate. As a substrate with a composite structure, glass epoxy substrate may be cited. The thickness of the substrate 20 is commonly determined by the material properties. It should be noted that as the substrate 20 a multi-layer substrate or built-up substrate may be used.

As shown in FIG. 1, the substrate 20 has an outline larger than the semiconductor chip 10. In more detail, the substrate 20 protrudes in at least a part beyond the outline of the mounted semiconductor chip 10. When the semiconductor chip 10 is rectangular in shape, the substrate 20 may form a rectangle larger than the outline of the semiconductor chip 10.

As shown in FIG. 1, the semiconductor chip 10 may be mounted on one surface of the substrate 20. Alternatively, semiconductor chips 10 may be mounted on both surfaces of the substrate 20.

In the example shown in FIG. 1, a single semiconductor chip 10 is mounted on the single substrate 20. Alternatively, two or more semiconductor chips 10 may be mounted on a single substrate 20.

In this case, the plurality of semiconductor chips 10 may be disposed to be arranged in a plane, or may be disposed so as to be laminated. When the plurality of semiconductor chips 10 is arranged in a plane, the substrate 20 has an outline which protrudes beyond the region in which the plurality of semiconductor chips 10 is mounted..

On the substrate 20, an interconnecting pattern 30 is formed. In this embodiment, the interconnecting pattern 30 is formed on one surface of the substrate 20. As shown in FIG. 1, as the one surface of the substrate 20, the interconnecting pattern 30 may be formed on the side of the substrate 20 on which the semiconductor chip 10 is mounted.

FIG. 2 is a plan view of the surface of the lowest substrate 20 on which the interconnecting pattern 30 is formed. The interconnecting pattern 30 includes a plurality of interconnecting lines in a particular pattern. In other words, by forming the plurality of interconnecting lines in a particular pattern on the substrate 20, the interconnecting pattern 30 is formed on the surface of the substrate 20. The interconnecting pattern 30 is formed, for example, of a conducting material such as copper or the like. The interconnecting pattern 30 may be formed by photolithography, sputtering or plating or the like. It should be noted that the interconnecting pattern 30 may, as shown in the second embodiment, be formed on both surfaces of the substrate 20.

The interconnecting pattern 30 further includes a plurality of electrical connections 32. As shown in FIG. 2, the electrical connections 32 may be formed to be larger in area than the interconnecting lines connected to the electrical connections 32. The electrical connections 32 may be lands.

The electrical connections 32 are electrically connected to the electrodes 12 of the semiconductor chip 10. As shown in FIG. 1, the semiconductor chip 10 may be mounted on the substrate 20 with the surface having the electrodes 12 opposed. That is to say, the semiconductor chip 10 may be subjected to face down bonding. In this case, the electrical connections 32 are formed in the region of the substrate 20 inside the semiconductor chip 10. Further in this case, the electrodes 12 and electrical connections 32 may be connected through the bumps 14. For the form of bonding of the electrodes 12 (bumps 14) and electrical connections 32, bonding by means of an anisotropic conducting material, metal bonding, bonding by means of the contraction force of a conducting paste or insulating resin and so exist, and any of them may be used. It should be noted that as shown in FIG. 1, between the semiconductor chip 10 and the substrate 20, some resin 70 is preferably present. By means of this, the mounting reliability between the semiconductor chip 10 and the substrate 20 can be improved. Furthermore, without using the projections as shown in FIG. 1, through first through holes 22, the interconnecting patterns 30 of upper and lower substrates 20 may be connected together by using an electrical connection means such as solder or wire bonding or the like.

Alternatively, the semiconductor chip 10 may be mounted on the substrate 20 with the surface opposite to that of the electrodes 12 opposing. In this case, the electrodes 12 and electrical connections 32 may be electrically connected by wires. In this case, the electrical connections 32 are formed in a region of the substrate 20 outside the semiconductor chip 10.

Alternatively, as is known as the TAB (Tape Automated Bonding) method, the technique may be applied in which finger leads projecting from a substrate 20 having a device hole larger than the semiconductor chip 10 into the device hole, and the electrodes 12 of the semiconductor chip 10 or bumps 14 are bonded.

These semiconductor chip bonding constructions can be applied to all of the subsequently described embodiments.

As shown in FIG. 1, a plurality of first terminals 40 is formed in a region of the substrate 20 outside the semiconductor chip 10. A pair of laminated substrates 20 has the first terminals 40 connected together, so that upper and lower semiconductor chips 10 are electrically connected. In more detail, a plurality of substrates 20 has the respective first terminals 40 formed on one substrate 20 disposed so as to overlie in plan view respective of the first terminals 40 of other substrates 20.

As shown in FIG. 1, the first terminals 40 may be formed at the extremity of the substrate 20. The first terminals 40 may be formed at the extremity of the substrate 20, and arranged along the edge of the semiconductor chip 10. By means of this, the outline of the substrate 20 can be made approximately the same size as the semiconductor chip 10. The first terminals 40 may be formed in one row or two rows, or may be arranged in a zigzag. It should be noted that the first terminals 40, as shown in FIG. 1, may be formed on the outside of the electrical connections 32 on the substrate 20. Alternatively, when the electrical connections 32 are formed in a region on the outside of the semiconductor chip 10, the first terminals 40 may be formed on the inside of the electrical connections 32 on the substrate 20.

In the example shown in FIG. 1, the first terminals 40 includes projections formed to protrude from the surface of the substrate 20. The projections of the first terminals 40 are formed with a height exceeding the semiconductor chip 10 on the substrate 20. By means of this, the first terminals 40 can be electrically connected to other first terminals 40 by the extremities of the projections. For the manner of electrical connection between the projections of the first terminals 40 and other first terminals 40, bonding of the electrodes 12 (bumps 14) and the interconnecting pattern 30 may be applied.

As shown in FIG. 1, the projections of the first terminals 40 may project from the surface of the substrate 20 through the first through holes 22 formed in the substrate 20. In this case, the first terminals 40 may project through the first through holes 22 from the surface opposite to the semiconductor chip 10 on the substrate 20. In other words, projections of the first terminals 40 may have their base ends positioned inside the first through holes 22, and passing through the first through holes 22 have their extremities projecting from the surface opposite to the semiconductor chip 10 on the substrate 20. By means of this, even when the interconnecting pattern 30 is formed on one surface of the substrate 20, electrical connection from both sides of the substrate 20 can be achieved.

In the example shown in FIG. 1, the projections of the first terminals 40 are formed by bending a part of the interconnecting pattern 30 away from the surface of the substrate 20. That is to say, the projections, of the first terminals 40 may be bent portions 42 of the interconnecting pattern 30.

In the example shown in FIG. 1, in a pair of upper and lower substrates 20, a part of the interconnecting pattern 30 (first terminals 40) of the upper substrate 20 is bent, and is connected to a part of the interconnecting pattern 30 (first terminals 40) of the lower substrate 20. For example, with regard to the bent portions 42, on the upper substrate 20, a part of the interconnecting pattern 30 formed on the surface opposite to the surface facing downward may be bent to penetrate inside the first through holes 22, and be formed to project from the surface facing downward. An embodiment of this type may have convexities not shown in the drawings, formed by extrusion from the surface of the substrate 20 opposite to the surface facing downward into the first through holes 22. By means of this, the component count of the semiconductor device can be reduced and a low cost semiconductor device can be provided.

The bent portions 42 may be filled with a conducting material 44. The conducting material 44 may be a conductive paste, a solder paste or plating or the like.

When bent portions 42 of the interconnecting pattern 30 are applied as the projections of the first terminals 40, as shown in FIG. 1, the side of the convexities 46 of the bent portions 42 may be connected to the side of the concavities 48 of the bent portions 42 of another substrate 20. The convexities 46 of the bent portions 42 may penetrate the concavities 48 of the bent portions 42 of the other substrates 20. In this case, first terminals 40 are bonded together on the inside of the first through holes 22. Alternatively, as shown in FIG. 1, if the concavities 48 of the bent portions 42 are filled with the conducting material 44, the convexities 46 of the bent portions may be bonded by means of the conducting material 44, without penetrating the concavities 48 of other bent portions. In this case, the first terminals 40 may be bonded together outside the first through holes 22. In the latter case, without making the height of the bent portions 42 wasteful, the upper and lower semiconductor chips 10 can be electrically connected.

Distinct from the above description, the projections of the first terminals 40 may be bumps (not shown in the drawings) provided on the interconnecting pattern 30. The bumps may be provided on lands of the interconnecting pattern 30. The bumps may project on the side of the substrate 20 opposite to that of the semiconductor chip 10 through the first through holes 22. In other words, the base end of the bumps may be disposed inside the first through holes 22, and the extremities of the bumps may project from the surface of the substrate 20 opposite to the semiconductor chip 10. It should be noted that bumps are formed of gold, solder, or other conducting material.

As shown in the example in FIG. 1, the first terminals 41 on the lowest substrate 20 may be part of the interconnecting pattern 30 (lands). That is to say, if upper and lower semiconductor chips 10 are electrically connected by means of the projections of the first terminals 40 provided in particular of the substrates 20, the first terminals 41 on one or a plurality of the substrates 20 (for example, the lowest substrate 20) need not be formed to project. It should be noted that other aspects of the construction of the first terminals 41 may be the same as the first terminals 40.

As shown in FIGS. 1 and 2, of the plurality of substrates 20, on the lowest substrate 20, a plurality of second terminals 50 is provided in a region inside the first terminals 41. One of the second terminals 50 is electrically connected to one of the first terminals 41. That is to say, an interconnecting line is formed to extend from each electrical connection 32, and one of each of the first and second terminals 41 and 50 are electrically connected.

The plurality of second terminals 50 is disposed so that the pitch is larger than the pitch of the plurality of first terminals. That is to say, the plurality of second terminals 50 may be subject to "pitch conversion" with respect to the plurality of first terminals 40. By means of this, by using the second terminals 50 for connection to other elements, the pitch is relatively wide, and the semiconductor device can be electrically connected to other elements. For example, by means of the second terminals 50, the semiconductor device can easily be positioned on a circuit board. By means of this, the yield when the semiconductor device is mounted can be raised. Since the formation of fine interconnecting lines on the circuit board is not required, a low cost circuit board can be used.

By forming such second terminals 50, the first terminals 41 (40) connecting upper and lower semiconductor chips 10 can be formed with a narrow pitch. Since the first terminal 41 (40) are formed in a region outside the semiconductor chip 10, by means of this the plan area of the semiconductor device can be made small.

As shown in FIG. 1, by making the plurality of semiconductor chips 10 into a single semiconductor device, in particular, when each of the plurality of semiconductor chips 10 has the same circuit construction, electrical connection of corresponding electrodes of the respective semiconductor chips can be achieved. For example, when the semiconductor chips 10 are memory, with the second terminals 50 of a semiconductor chip 10 as address terminals or data terminals, sharing is made easy. In more detail, from the second terminals 50 of a semiconductor chip 10, information in a memory cell at the same address of each semiconductor chip can be read out or written.

In the example shown in FIG. 1, on the lowest substrate 20, the semiconductor chip 10 is mounted only on the surface facing the other substrates 20. By means of this, the second terminals 50 can be formed in a region of the substrate 20 inside the first terminals 41. In particular, the second terminals 50 can be formed in a region of the substrate 20 inside the semiconductor chip 10. Therefore, the plan area of the semiconductor device can be kept down, and the second terminals 50 can be formed in a region of the substrate 20 extending two-dimensionally, with a wide pitch. It should be noted that the plurality of second terminals 50 may be disposed in a matrix of a plurality of rows and a plurality of columns as shown in FIG. 2, or in a staggered configuration.

As shown in FIG. 1, the second terminals 50 may include external terminals projecting from the surface of the lowest substrate 20 opposite to the surface opposing other substrates 20.

The external terminals of the second terminals 50 may project from the surface of the substrate 20 through the second through holes 24 formed in the substrate 20. For example, the external terminals of the second terminals 50 may project from the surface opposite to the side of the substrate 20 on which the interconnecting pattern 30 is formed through the second through holes 24 interposed. It should be noted that the plurality of second through holes 24 is preferably formed in a portion of the substrate 20 overlying the interconnecting pattern 30.

In the example shown in FIG. 1, the external terminals of the second terminals 50 are formed by bending a part of the interconnecting pattern 30. In more detail, the external terminals of the second terminals 50 are bent portions 52 of the interconnecting pattern 30 formed by bending the interconnecting pattern 30 in the direction away from the surface opposite to the surface of the lowest substrate 20 opposing other substrates 20. The bent portions 52 may have the same form as the bent portions 42 of the first terminals 40. For example, as shown in the drawings, the bent portions 52 may have a part of the interconnecting pattern 30 bent to penetrate inside the first through holes 22, and be formed to project in the direction away from the surface of the substrate 20 opposite to the lowest interconnecting pattern 30. An embodiment of this type may have convexities not shown in the drawings formed by extrusion from one surface of the substrate 20 into the second through holes 24. By means of this, the component count of the semiconductor device can be reduced and a low cost semiconductor device can be provided.

The interior of the bent portions 52 may be filled with a conducting material 54. conducting material 54 may be a conducting paste, solder paste or plating or the like.

According to this embodiment, the lowest second terminals 50 have a wider pitch than the first terminals 41 (40). By means of this, the semiconductor device can easily be positioned on a cirucit board. Therefore, the yield when the semiconductor device is mounted can be raised. Since it is not necessary to form fine interconnecting lines on the circuit board, a low cost circuit board can be used.

By means of the formation of the second terminals 50, first terminals 40 (41) for connection of upper and lower semiconductor chips 10 can be formed with a narrow pitch. The first terminals 40 (41) are formed in a region ouside the semiconductor chip 10, and therefore the plan area of the semiconductor device can be made small.

The method of manufacture of this embodiment of the semiconductor device includes steps of disposing in lamination a plurality of substrates 20 having the above described semiconductor chip 10, and electrically connecting upper and lower semiconductor chips 10 by means of the first terminals 40 (41) of the substrate 20. In this case, on the lowest substrate 20, second terminals 50 are disposed electrically connected to one of the semiconductor chips 10. The plurality of second terminals 50 is on the inside of the first terminals 41, and has a wider pitch than the first terminals 41. By means of this, a semiconductor device of stacked construction which can easily be mounted on a circuit board can be manufactured.

Variant

FIG. 3 shows a variant of this embodiment of the semiconductor device. The semiconductor device 2 shown in FIG. 3 differs from the above description in the form of the first and second terminals 140 and 150.

In the example shown in FIG. 3, in a pair of upper and lower substrates 20, a part of the interconnecting pattern 30 (first terminals 140) of the lower substrate 20 is bent, and connected to the interconnecting pattern 30 (first terminals 140) of the upper substrate 20. In this case, for example, the bent portions 142 of a particular substrate 20 may project in the opposite direction to the first through holes 22 of that substrate 20. In this case, the bent portions 142 may be bent and penetrate inside the first through holes 22 of the other substrate 20. Such bent portions 142 may have convexities not shown in the drawings formed by extrusion from the inside of the first through holes 22 toward the outside. By means of this, the component count of the semiconductor device can be reduced and a low cost semiconductor device can be provided.

The bent portions 142 may be filled with a conducting material 144. The conducting material 144 may be a conducting paste, solder paste or plating or the like.

In the example shown in FIG. 3, the convexities 146 of the bent portions 142 are connected to portions of the interconnecting pattern 30 on another substrate 20 exposed through the first through holes 22. The convexities 146 of the bent portions 142 may penetrate concavities 148 of the bent portions 142 of another substrate 20. In this case, both bent portions 142 are bonded outside the first through holes 22. Alternatively, by filling the concavities 148 with the conducting material 144, the convexities 146 of one of the bent portions 142 may be bonded without penetrating the concavities 148 of the other bent portion 142. In this case, the conducting material 144 may be provided to extend as far as inside the first through holes 22. When the conducting material 144 is provided, without wasting the height of the bent portions, the upper and lower semiconductor chips 10 can be electrically connected.

As shown in the example in FIG. 3, first terminals 141 of the uppermost substrate 20 may be a part of the interconnecting pattern 30 (lands). The rest of the construction of the first terminals 141 may be the same as the first terminals 140.

It should be noted that the configuration of bending the interconnecting pattern 30, and connecting the first terminals 40 (140) together is not a limitation thereon, and configurations known in the art can be applied.

As shown in FIG. 3, the external terminals of the second terminals 150 may be bumps (not shown in the drawings) provided on the interconnecting pattern 30. The bumps may be provided on lands of the interconnecting pattern 30. The bumps may project through the first through holes 22 to the side of the substrate 20 opposite to that of the semiconductor chip 10. In other words, the base end of the bumps is disposed inside the second through holes 24, and the extremities of the bumps project from the surface of the substrate 20 opposite to the semiconductor chip 10. It should be noted that the bumps are formed of gold, solder, or other conducting material.

Alternatively, the second terminals 150 may be lands for the purpose of providing external terminals. That is to say, without going to great lengths to provide external terminals, for example, when mounting on a circuit board using a solder cream spread on the circuit board, as a result of the surface tension when this is melted, external terminals may be formed. This semiconductor device is a so-called land grid array type of semiconductor device. These configurations, may as described below be applied to the case in which the interconnecting pattern 30 is formed on both sides of the substrate 20.

In this variant too, the same benefit as described above can be obtained.

Second Embodiment

Figure 4:
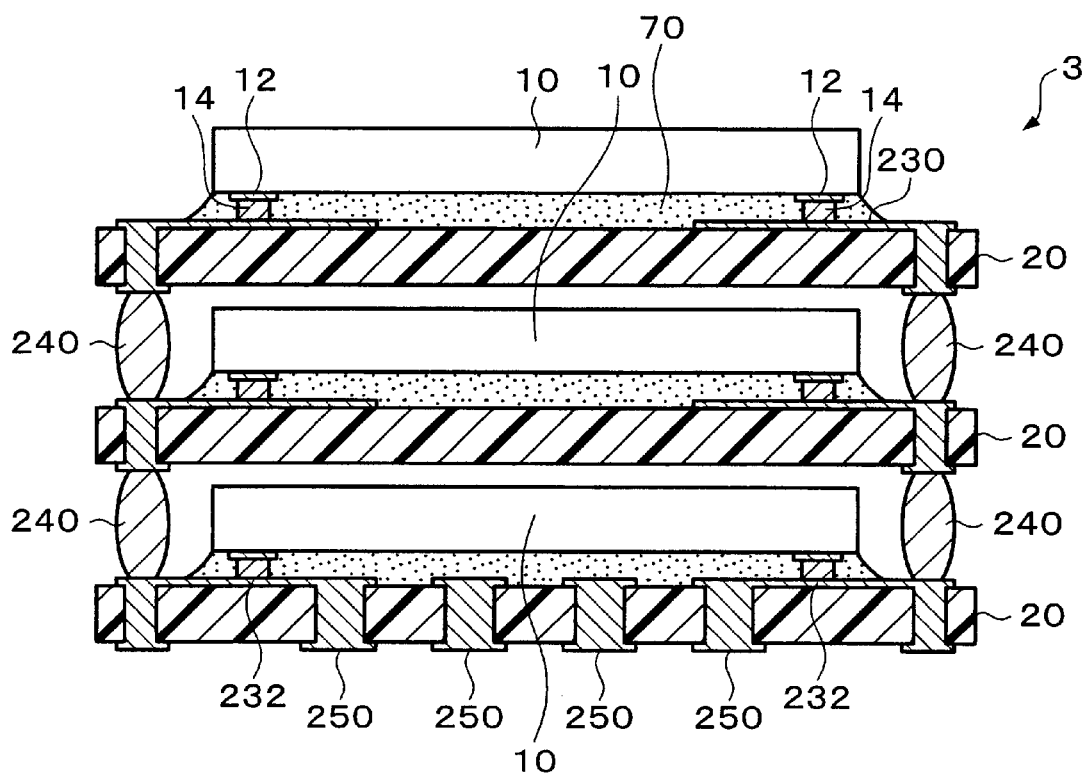
FIG. 4 shows a second embodiment of the semiconductor device to which the present invention is applied.

FIG. 4 is a sectional view of this embodiment of the semiconductor device. This embodiment differs from the above described example in the form of an interconnecting pattern 230 formed on the substrate 20. The interconnecting pattern 230 comprises a plurality of interconnecting lines and electrical connections 232.

As shown in FIG. 4, the interconnecting pattern 230 is formed on both surfaces of the substrate 20. As shown in the drawing, by means of plurality of through holes in the substrate 20, the interconnecting pattern 230 may be formed with both surfaces electrically connected. The through holes, as shown in the drawing, may be filled with the material of the interconnecting pattern 230. Alternatively, the through holes may be formed with through holes in a central portions, and may be vertically electrically conducting on the periphery formed by the inner wall. It should be noted that the interconnecting pattern 230 may be formed by providing a conducting material in the through holes different from the interconnecting lines of the substrate 20.

As shown in FIG. 4, the interconnecting pattern 230 may be formed only in the positions that the first and second terminals 240 and 250 are provided, on the surface opposite to that of the semiconductor chip 10. Alternatively, through holes may be provided in other positions, and on the surface of the substrate 20 opposite to that of the semiconductor chip 10, interconnecting lines may be formed connected to the first and second terminals 240 and 250.

In the example shown in FIG. 4, first terminals 240 include projections. The projections of the first terminals 240 may, for example, be bumps. The bumps are formed with a height exceeding the thickness of the semiconductor chip 10 on the substrate 20.

On the other hand, the second terminals 250 may be a part of the interconnecting pattern 230. The second terminals 250 may be lands of the interconnecting pattern 230.

In this embodiment too, the same benefit as described above can be obtained.

In all of the above described embodiments, examples are shown in which the second terminals 50, 150, and 250 are disposed inside the region of the substrate 20 in which the semiconductor chip 10 is mounted, but this is not limiting of the present invention, and for example, the second terminals may be disposed outside the region of the substrate 20 in which the semiconductor chip 10 is mounted. When the second terminals are formed outside the region in which the semiconductor chip 10 is mounted, the region in which the second terminals are disposed can be reinforced by a reinforcing member or the like according to the strength of the substrate 20, and the planarity of the plurality of second terminals may be assured. By means of this, a large number of terminals can easily be connected.

Figure 5:
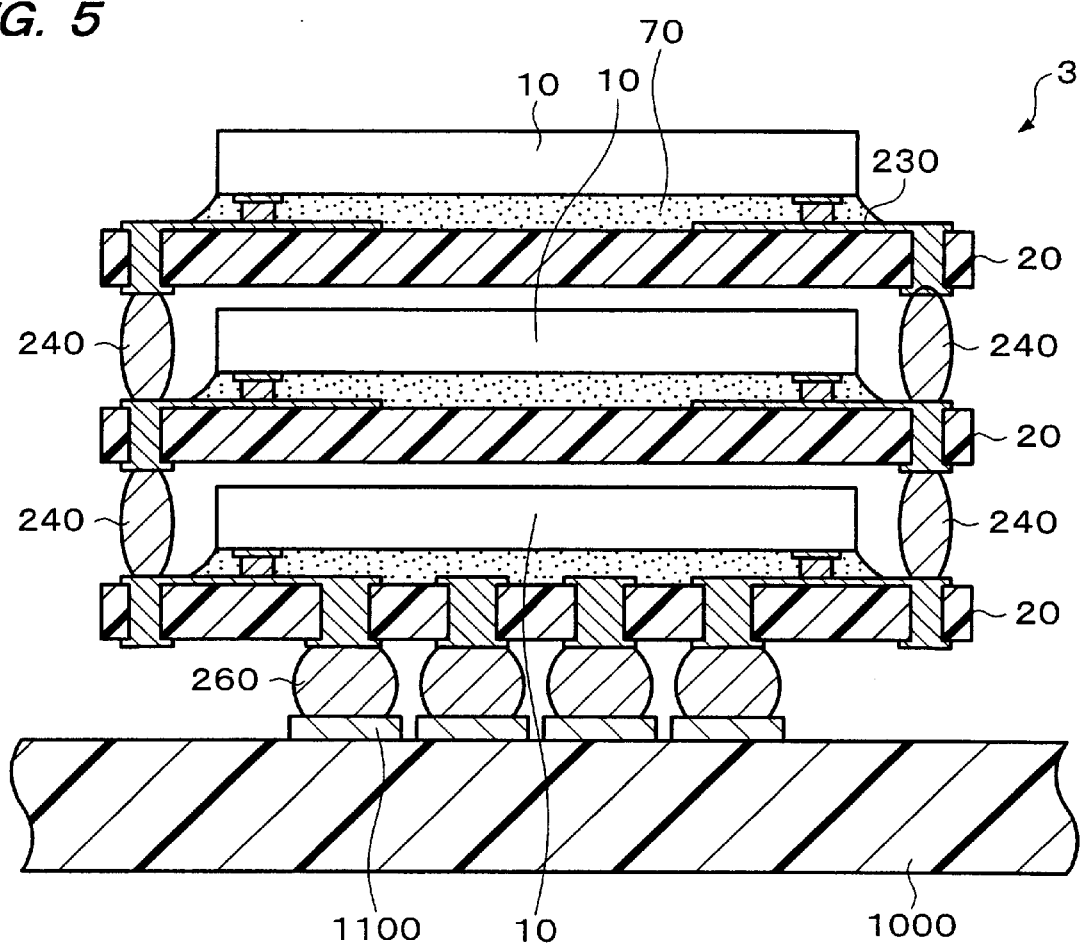
FIG. 5 shows a circuit board on which is mounted the embodiment of the semiconductor device to which the present invention is applied.

FIG. 5 shows a circuit board 1000 on which is mounted the semiconductor device 3 of the above described embodiment. For the circuit board 1000 is generally used an organic substrate such as, for example, a glass epoxy substrate or the like. On the circuit board 1000, an interconnecting pattern 1100 is formed in a desired circuit, for example, of copper or the like, and this interconnecting pattern 1100 is electrically connected with the second terminals 250 of the semiconductor device 3. The bonding between the two may be achieved with a conducting material such as solder or the like 260 interposed.

Figure 6:
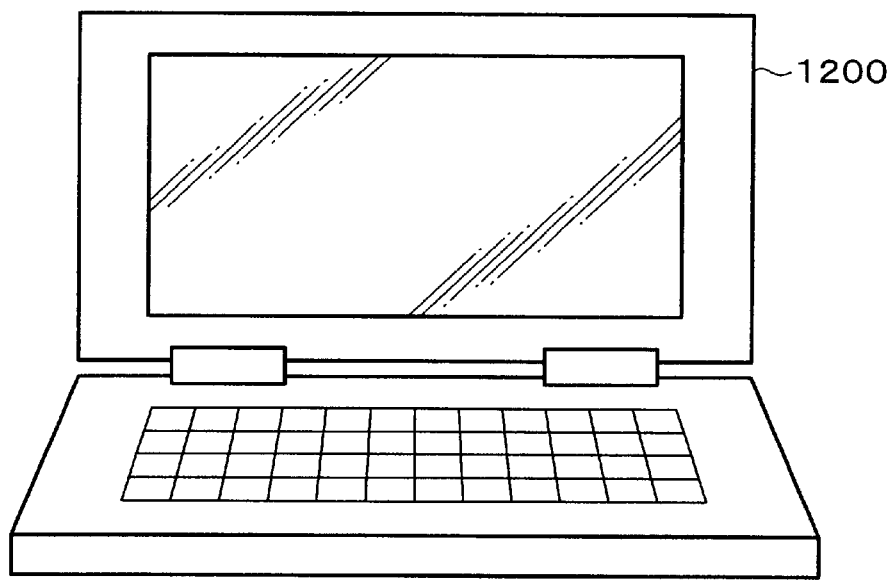
FIG. 6 shows an electronic instrument having the embodiment of the semiconductor device to which the present invention is applied.
Figure 7:
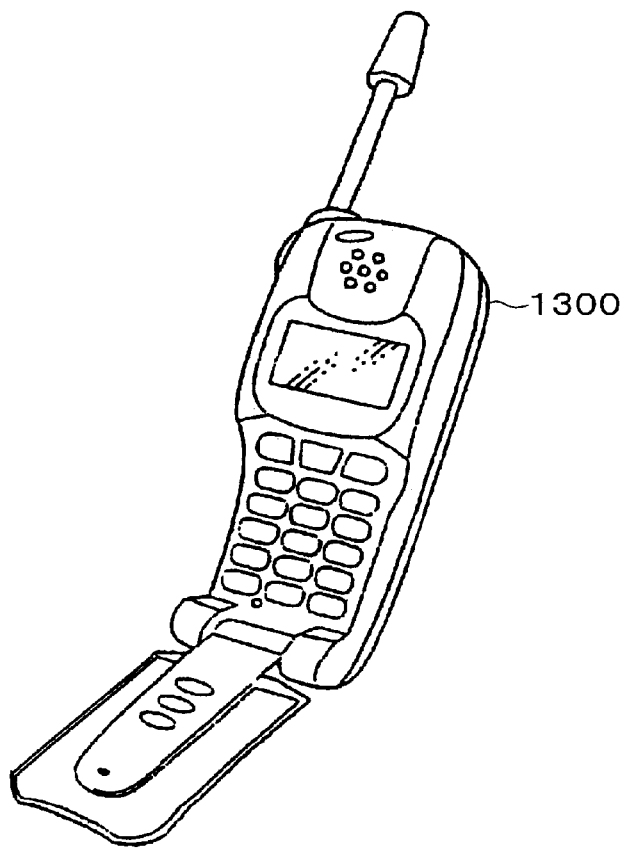
FIG. 7 shows an electronic instrument having the embodiment of the semiconductor device to which the present invention is applied.

Then as an electronic instrument having a semiconductor device to which the present invention is applied, FIG. 6 shows a notebook personal computer 1200, and FIG. 7 shows a mobile telephone 1300.

What is claimed is:

1. A semiconductor device comprising:

a plurality of semiconductor chips; and a plurality of substrates, each of the substrates having one of the semiconductor chips mounted thereon in a first region thereof, wherein:

the substrates are stacked over top of each other;

a first semiconductor chip mounted on a first stacked substrate is electrically connected to a second semiconductor chip mounted on a second stacked substrate through first terminals provided in a second region of each of the first and second stacked substrates outside the first region;

a lowest substrate of the stacked substrates having second terminals provided in a third region of the lowest substrate that is closer to a center of the lowest substrate than the second region, the second terminals electrically connected to one of the semiconductor chips; and a pitch of adjacent two of the second terminals is wider than a pitch of adjacent two of the first terminals.

2. The semiconductor device of claim 1, wherein:

the first terminals are arranged along an edge of one of the semiconductor chips; and the second terminals are provided in the first region such that the third region is within the first region.

3. The semiconductor device of claim 1, wherein:

the first terminals have projections formed to project from a surface of one of the substrates; and by means of the projections of the first terminals, the first semiconductor chip is electrically connected to the second semiconductor chip.

4. The semiconductor device of claim 3, wherein:

in each of the substrates, a plurality of first through holes are formed; and the projections of the first terminals project from the surface of one of the substrates through the first through holes.

5. The semiconductor device of claim 3, wherein:
on each of the substrates, an interconnecting pattern is formed;
the first terminals are a part of the interconnecting pattern; and
the projections of the first terminals are formed by a part of the interconnecting pattern being bent in the direction away from the surface of one of the substrates.

6. The semiconductor device of claim 3, wherein:
on each of the substrates, an interconnecting pattern is formed; and
the projections of the first terminals are bumps provided so as to be electrically connected to the interconnecting pattern.

7. The semiconductor device of claim 5, wherein:
the second terminals have external terminals on the lowest substrate of the stacked substrates, the external terminals projecting from a surface of the lowest substrate of the stacked substrates, the surface opposite to that opposing another of the stacked substrates.

8. The semiconductor device of claim 6, wherein:
the second terminals have external terminals on the lowest substrate of the stacked substrates, the external terminals projecting from a surface of the lowest substrate of the stacked substrates, the surface oppposite to that opposing another of the stacked substrates.

9. The semiconductor device of claim 7, wherein:
in the lowest substrate of the stacked substrates, a plurality of second through holes are formed; and
the external terminals of the second terminals project through the second through holes from the surface opposite to that opposing another of the stacked substrates.

10. The semiconductor device of claim 8, wherein:
in the lowest substrate of the stacked substrates, a plurality of second through holes are formed; and
the external terminals of the second terminals project through the second through holes from the surface opposite to that opposing another of the stacked substrates.

11. The semiconductor device of claim 7, wherein:
the external terminals of the second terminals are bumps provided so as to be electrically connected to the interconnecting pattern.

12. The semiconductor device of claim 5, wherein:
the second terminals are a part of the interconnecting pattern.

13. The semiconductor device of claim 6, wherein:
the second terminals are a part of the interconnecting pattern.

14. The semiconductor device of claim 7, wherein:
the second terminals are a part of the interconnecting pattern.

15. The semiconductor device of claim 9, wherein:
the second terminals are a part of the interconnecting pattern.

16. The semiconductor device of claim 14, wherein:
the external terminals of the second terminals are formed by bending a part of the interconnecting pattern in the direction away from the surface opposite to that opposing another of the substrates.

17. The semiconductor device of claim 15, wherein:
the external terminals of the second terminals are formed by bending a part of the interconnecting pattern in the direction away from the surface opposite to that opposing another of the substrates.

18. A circuit board on which a semiconductor device is mounted, the semiconductor device comprising:
a plurality of semiconductor chips; and
a plurality of substrates, each of the substrates having one of the semiconductor chips mounted thereon in a first region thereof, each of the substrates having an outline larger than each of the semiconductor chips, wherein:
the substrates are stacked over top of each other;
a first semiconductor chip mounted on a first stacked substrate is electrically connected to a second semiconductor chip mounted on a second stacked substrate through first terminals provided in a second region of each of the first and second stacked substrates outside the first region;
a lowest substrate of the stacked substrates having second terminals provided in a third region of the lowest substrate that is closer to a center of the lowest substrate than the second region, the second terminals electrically connected to one of the semiconductor chips; and
a pitch of adjacent two of the second terminals is wider than a pitch of adjacent two of the first terminals,
wherein the semiconductor device is electrically connected to the circuit board through the second terminals.

19. An electronic instrument comprising a semiconductor device, the semiconductor device comprising:
a plurality of semiconductor chips; and
a plurality of substrates, each of the substrates having one of the semiconductor chips mounted thereon in a first region thereof, each of the substrates having an outline larger than each of the semicondutor chips, wherein:
the substrates are stacked over top of each other;
a first semiconductor chip mounted on a first stacked substrate is electrically connected to a seocnd semiconductor chip mounted on a second stacked substrate through first terminals provided in a second region of each of the first and second stacked substrates outside the first region;
a lowest substrate of the stacked substrates having second terminals provided in a third region of the lowest substrate that is closer to a center of the lowest substrate than the second region, the second terminals electrically connected to one of the semiconductor chips; and
a pitch of adjacent two of the second terminals is wider than a pitch of adjacent two of the first terminals.

20. A method of manufacture of a semiconductor device comprising the steps of:
stacking a plurality of substrates, each of the substrates having one of semiconductor chips mounted thereon in a first region thereof, each of the substrates having an outline larger than each of the seminconductor chips; and
electrically connecting a first semiconductor chip mounted on a first stacked substrate to a second semiconductor chip mounted on a second stacked substrate through first terminals provided in a second region of each of the first and second stacked substrates outside the first region,
wherein a lowest substrate of the stacked substrates having second terminals provided in a third region of the lowest substrate that is closer to a center of the lowest substrate than the second region, the second terminals are electrically connected to one of the semiconductor chips, and a pitch of adjacent two of the second terminals is wider than a pitch of adjacent two of the first terminals.

* * * * *